United States Patent [19]
Moriike

[11] Patent Number: 6,028,288
[45] Date of Patent: Feb. 22, 2000

[54] LASER BEAM MACHINE AND LIQUID CRYSTAL DISPLAY DEVICE FABRICATION METHOD USING THE MACHINE

[75] Inventor: Tatsuya Moriike, Fukushima-ken, Japan

[73] Assignee: ALPS Electric Co., Ltd., Tokyo, Japan

[21] Appl. No.: 08/731,526

[22] Filed: Oct. 16, 1996

[30] Foreign Application Priority Data

Oct. 23, 1995 [JP] Japan .................................... 7-274386

[51] Int. Cl.[7] .................................................. B23K 26/06
[52] U.S. Cl. .............................. 219/121.69; 219/121.77; 219/121.85
[58] Field of Search .................. 219/121.69, 121.77, 219/121.85; 438/30; 216/23; 349/187; 430/20

[56] References Cited

U.S. PATENT DOCUMENTS

| | | | |
|---|---|---|---|
| 4,533,813 | 8/1985 | Rayburn et al. | 219/121.77 X |
| 4,680,855 | 7/1987 | Yamazaki et al. | 219/121.69 |
| 5,340,619 | 8/1994 | Chen et al. | 216/23 X |
| 5,373,137 | 12/1994 | McLaughlin | 219/121.77 X |
| 5,708,252 | 1/1998 | Shinohara et al. | 219/121.73 |

FOREIGN PATENT DOCUMENTS

| | | | |
|---|---|---|---|
| 0656241 | 6/1995 | European Pat. Off. | |
| 207347 | 2/1984 | Germany | 219/121.77 |
| 53-73692 | 6/1978 | Japan | 219/121.77 |
| 5-203807 | 8/1993 | Japan . | |

*Primary Examiner*—Gregory Mills
*Attorney, Agent, or Firm*—Brinks Hofer Gilson & Lione

[57] ABSTRACT

To provide a liquid crystal display device fabrication method making it possible to form a desired opaque film around a color filter at a low cost.

Color filters 52 are locally removed through laser trimming by a laser beam machine provided with a machine body in which a rotatable phase difference plate and a beam splitter are arranged in the optical path of a laser beam and moreover provided with an XY table, mounting a workpiece in which a plurality of transparent electrodes 51 and color filters 52 superposed on transparent electrodes 51 are previously formed on a transparent substrate on the XY table, and applying a plurality of beam spots S to the workpiece in a direction perpendicular to the longitudinal direction of color filters 52 at a certain pitch.

5 Claims, 8 Drawing Sheets

LASER BEAM MACHINE AND LIQUID CRYSTAL DISPLAY DEVICE FABRICATION METHOD USING THE MACHINE

BACKGROUND OF THE INVENTION

1. Field of the Invention

The present invention relates to a method for fabricating a full-color-displaying liquid crystal display device improving the display quality by trimming a color filter on a transparent substrate to form an opaque film (black matrix) around the color filter and thereby eliminating stray light.

2. Description of the Related Art

An art has been known so far which improves the display quality by forming an opaque film (black matrix) around each color filter on a transparent substrate and thereby eliminating stray light in the fabrication process of a full-color-displaying liquid crystal display device as disclosed in the official gazette of, for example, Japanese Unexamined Patent Publication No. 282223.

The outline of the prior art is described below. First, a transparent electrode linearly extending at a certain pitch is formed on one side of a transparent substrate made of glass or the like to form a photoresist layer on the transparent-electrode formed plane, thereafter a mask having a plurality of slits is superposed on the photoresist layer to apply exposure light from the mask side and develop the layer, and then undeveloped photoresist is removed to leave a stripe-like photoresist layer crossing a plurality of transparent electrodes. Then, R (red), G (green), and B (blue) color filters are superposed on exposed transparent electrodes with no stripe-like photoresist layer formed on them by the electrodeposition method, coloring method, or printing method and baked and cured. Then, the stripe-like photoresist layer is removed by an alkali solution or the like and thereafter, a photoresist layer containing black pigment (so-called black resist layer) is formed on the color filter formed plane (transparent electrode formed plane) of the transparent substrate to develop the layer by applying exposure light from the back, and finally a matrix-like opaque film is formed at gap portions around the color filters by removing unexposed black resist.

However, to form an opaque film (black matrix) around a color filter by the above conventional method, there are problems that the fabrication process is complicated and the cost is inevitably increased because exposure and development of a photoresist layer must be performed twice respectively.

Moreover, the above conventional method has a problem that, because photoresist having a heat-resistant temperature of approx. 150° C. is heated up to approx. 250° C. when baking a color filter, the photoresist causing seizing in the baking step adheres to the surface of a transparent electrode and it is not easily removed. That is, because exposed photoresist changes to gray in color, if a part of a stripe-like photoresist layer remains, photoresist (black resist) thereafter formed is locally insufficiently exposed, a defective opaque film is formed around the color filter, and resultingly the display quality is deteriorated.

SUMMARY OF THE INVENTION

The present invention is made to solve the above problems of the prior art and its object is to provide a liquid crystal display device fabrication method capable of inexpensively forming a desired opaque film around a color filter.

To achieve the above object, the present invention uses a laser beam machine provided with a laser beam machine body for converting a linear polarized beam of a laser beam supplied from a laser beam oscillator to a circular polarized beam by a phase difference member, thereafter leading the circular polarized beam to a beam splitter, and thereby dividing the laser beam to a plurality of linear polarized beams and applying these divided beams to a workpiece as spots through an object glass and an XY table capable of mounting the workpiece and transferring it in two directions perpendicular to each other; locally removes the color filter by applying the divided beams to a workpiece obtained by forming a plurality of transparent electrodes extending in one direction and color filters superposed on the transparent electrodes on a transparent substrate at a certain pitch in the direction perpendicular to the longitudinal direction of the color filter while mounting the workpiece on the XY table and controlling the XY table; thereafter forms a plurality of color filters separate from each other on the transparent substrate, and then forms an opaque film made of black resist around the color filters. Moreover, the above object is achieved by setting the phase difference member so as to be rotatable about the optical axis of the laser beam.

It is possible to remove only a color filter from a transparent electrode by adjusting the power (energy level) of a laser beam and applying the laser beam. Therefore, by controlling an X table and a Y table and thereby moving the transparent substrate along a predetermined orbit in a plane horizontal to a beam spot, it is possible to simply trim a color filter formed like a stripe on the transparent substrate through the transparent electrode at a certain pitch in the direction perpendicular to the longitudinal direction of the color filter. Therefore, it is possible to omit the masking step which has been performed to specify the shape of a color filter and the photoresist exposing and developing steps and moreover, simplify the fabrication process.

Furthermore, because a color filter is trimmed by applying a plurality of divided beams, a plurality of portions can simultaneously be trimmed and the machining time can greatly be decreased. In this case, though the power of every laser beam necessary to remove only a color filter must be adjusted, it is possible to remove a fluctuation from powers of divided beams by properly rotating the phase difference member provided for the optical system of the laser beam machine.

Furthermore, as described above, when it is unnecessary to form a photoresist layer before baking a color filter, the problem is also solved that photoresist causes seizing and remains when it is removed. Therefore, it is possible to form a non-defective opaque film around the color filter.

DESCRIPTION OF THE PREFERRED EMBODIMENTS

An embodiment of the present invention is described below by referring to FIGS. 1 to 11.

Figure 1:
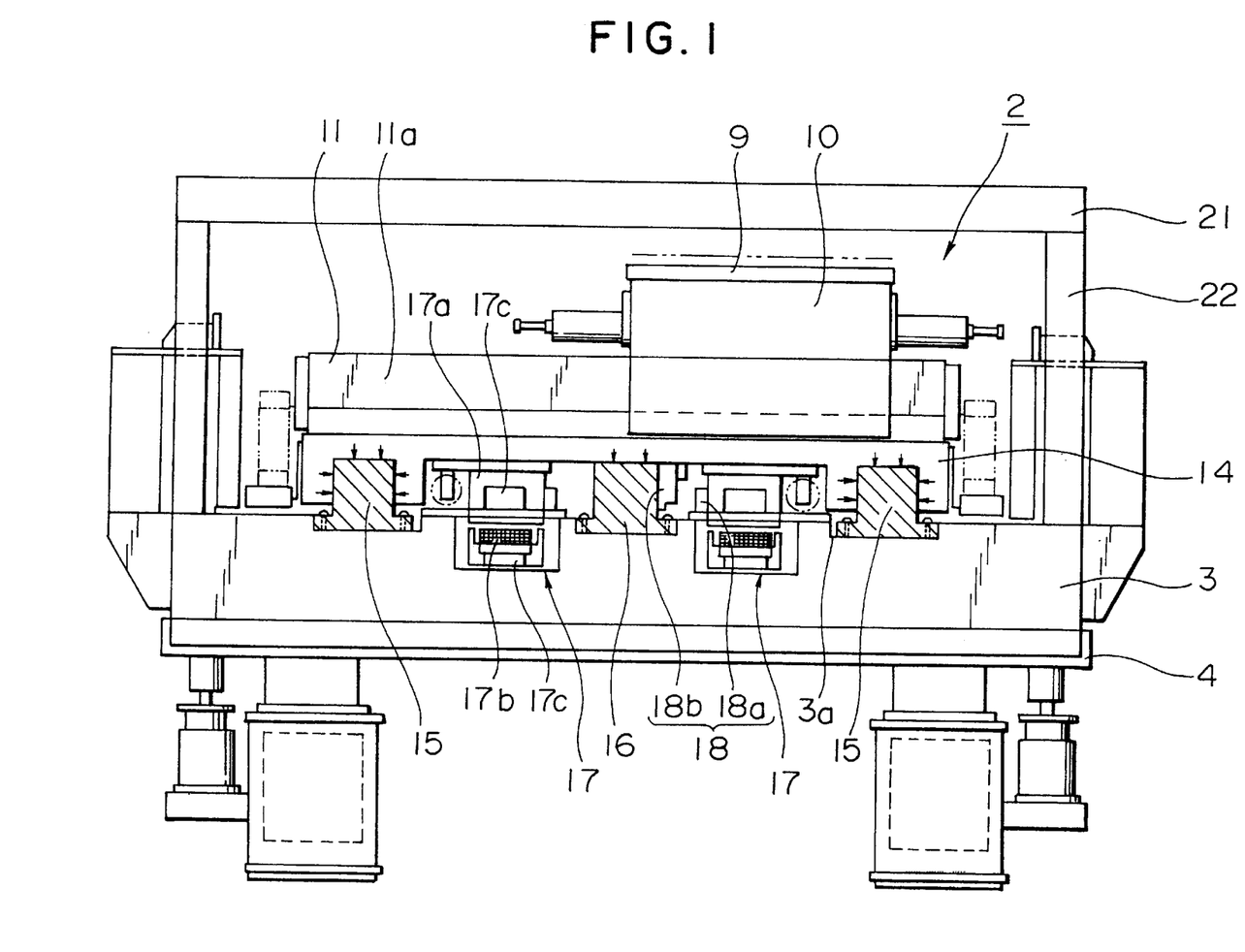
FIG. 1 is a front view of an XY table built in the laser beam machine of the present embodiment.
Figure 2:
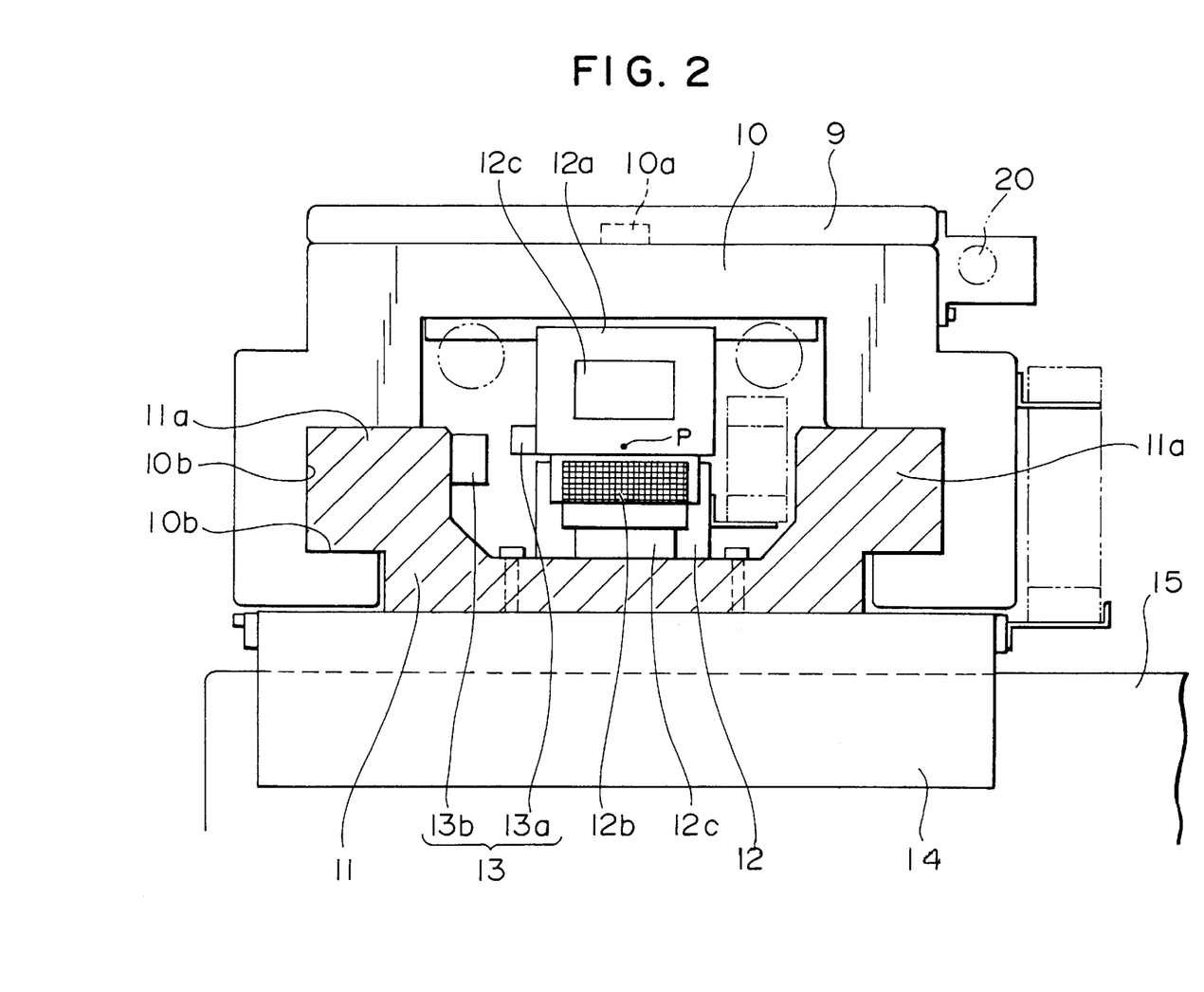
FIG. 2 is a side view of the XY table in FIG. 1 whose illustration is locally omitted.
Figure 3:
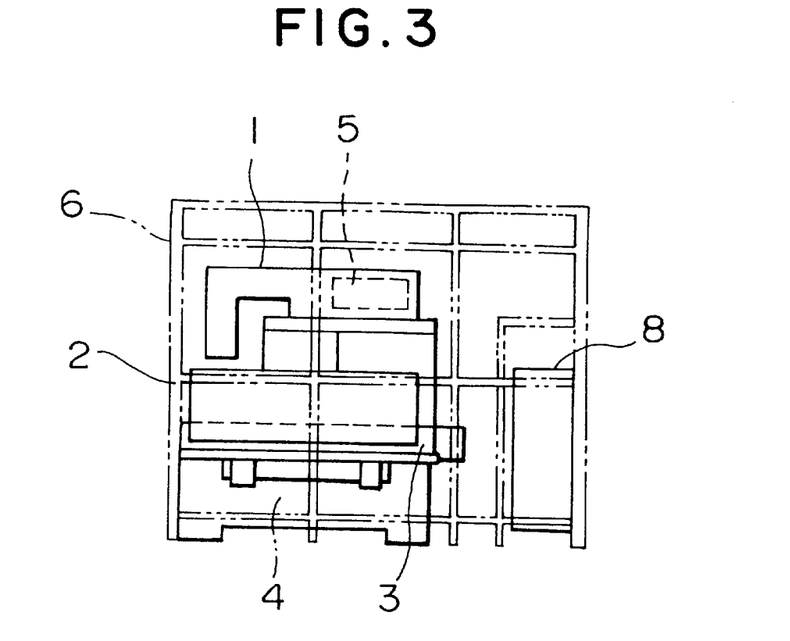
FIG. 3 is a general side view of a laser beam machine including the XY table in FIG. 1.
Figure 4:
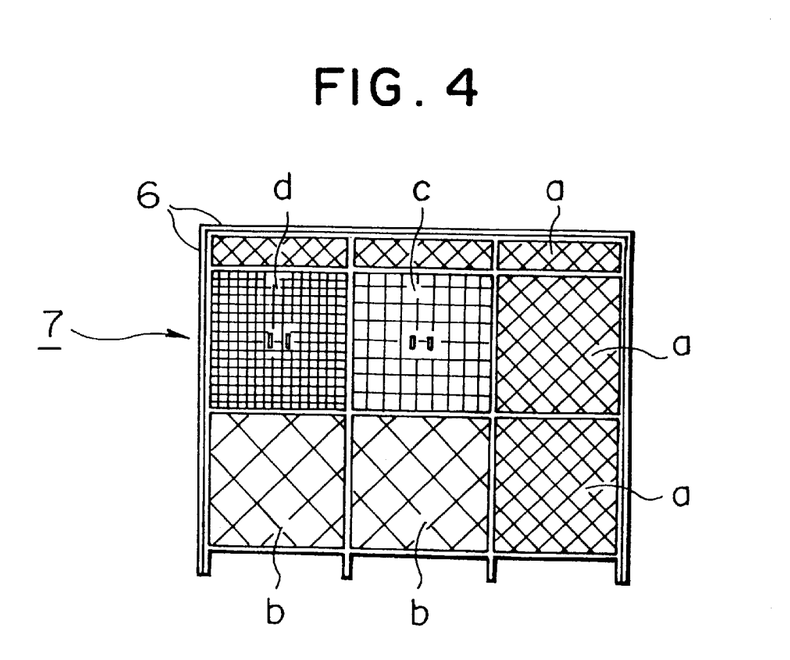
FIG. 4 is a side view of the portion of a safety cover for covering the laser beam machine in FIG. 3 corresponding to FIG. 3.
Figure 5:
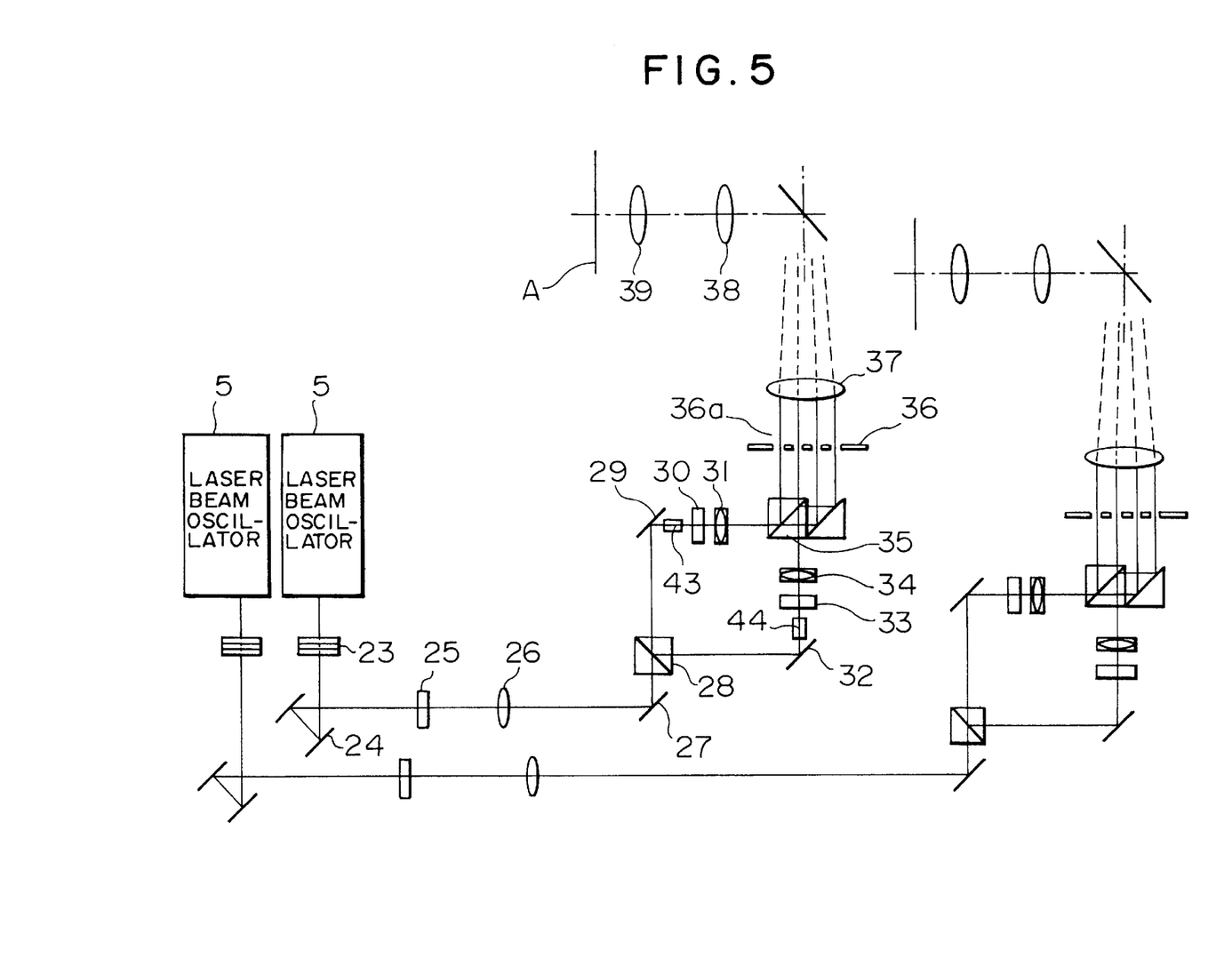
FIG. 5 is an illustration showing the layout of an optical system of the laser beam machine in FIG. 3 arranged in the optical path of a laser beam.
Figure 6:
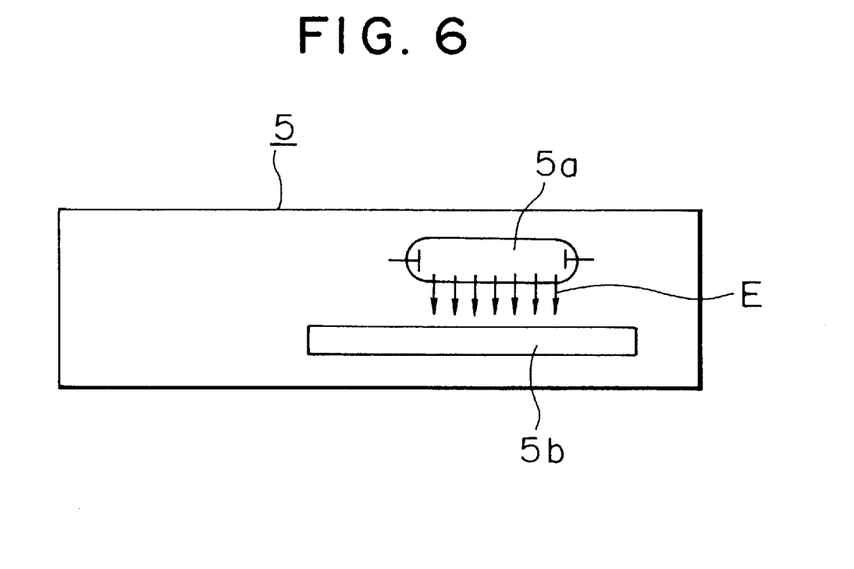
FIG. 6 is an illustration for explaining an laser beam oscillator of the laser beam machine in FIG. 3.
Figure 7:
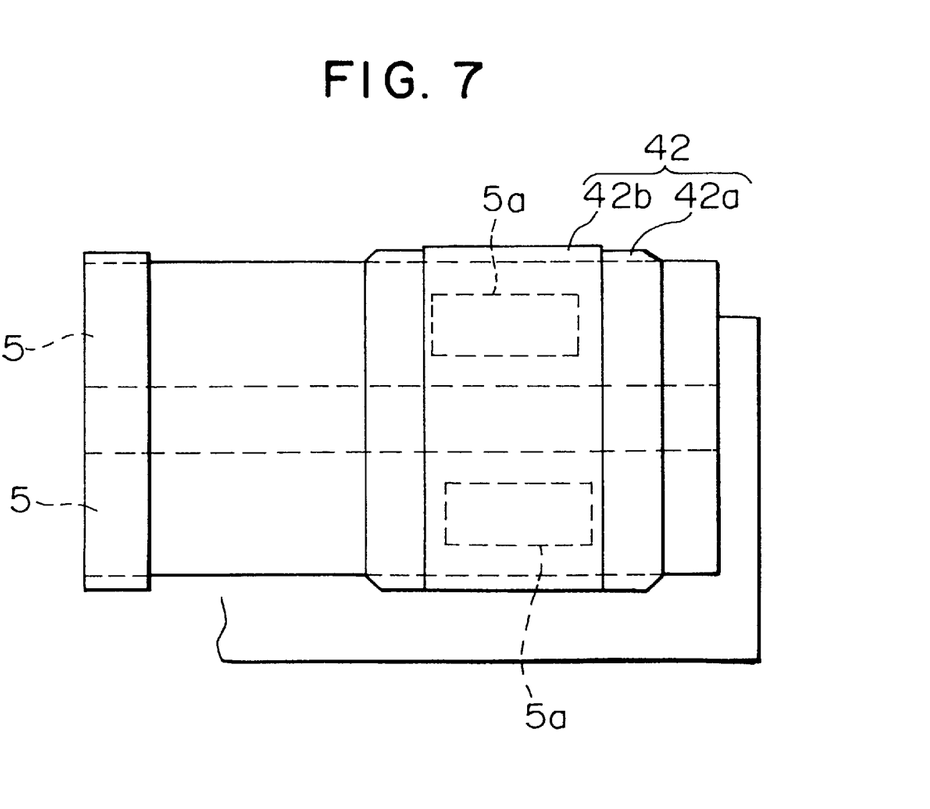
FIG. 7 is a top view showing a state in which a degaussing cover is set to the laser beam oscillator in FIG. 6.
Figure 8:
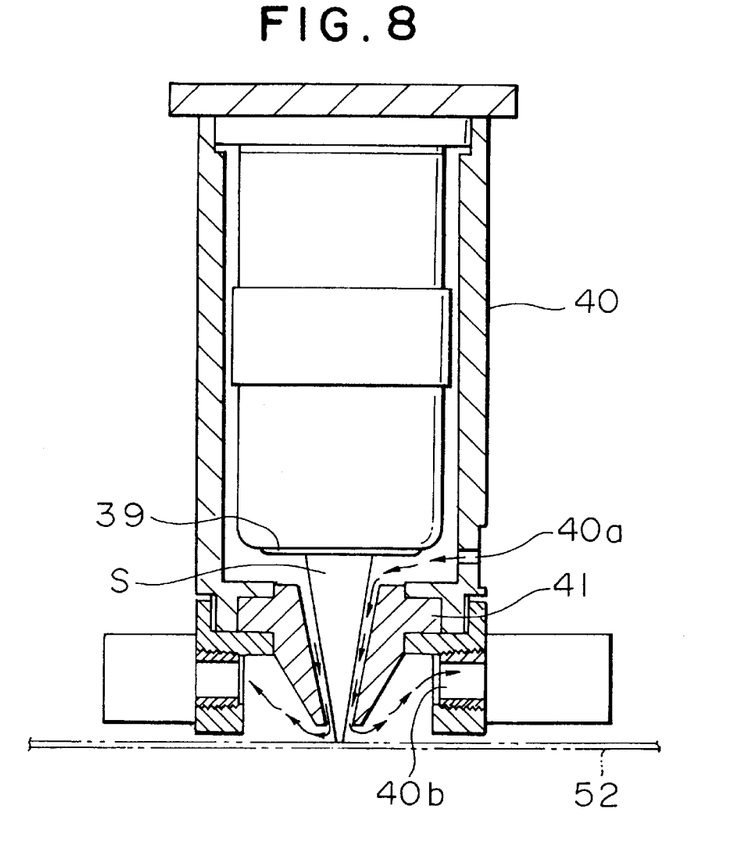
FIG. 8 is an illustration showing a beam applying section of the laser beam machine in FIG. 3.
Figure 9:
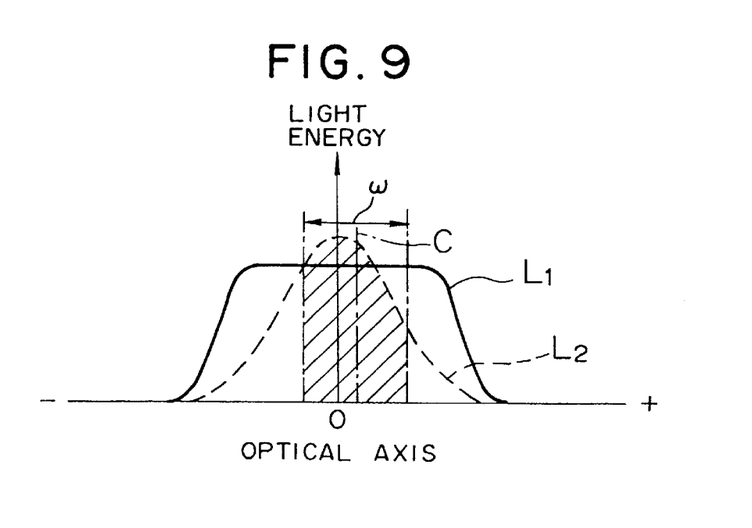
FIG. 9 is a characteristic diagram showing energy distributions about the optical axis of a laser beam emitted from an optical fiber of the optical system in FIG. 5.
Figure 10A:
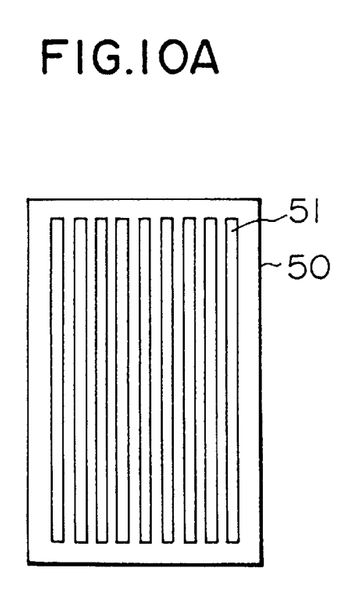
FIGS. 10A to 10D are process illustrations showing a liquid crystal display device fabrication method for trimming a color filter by the laser beam machine in FIG. 3.
Figure 10B:
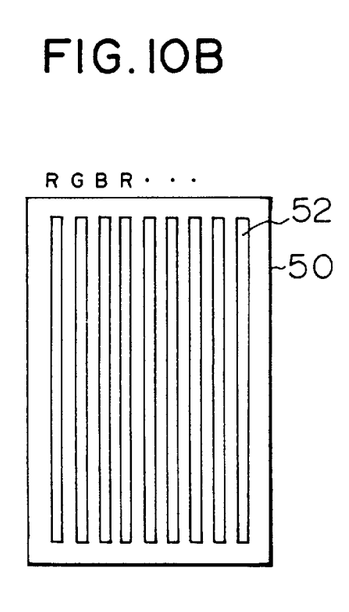
Figure 10C:
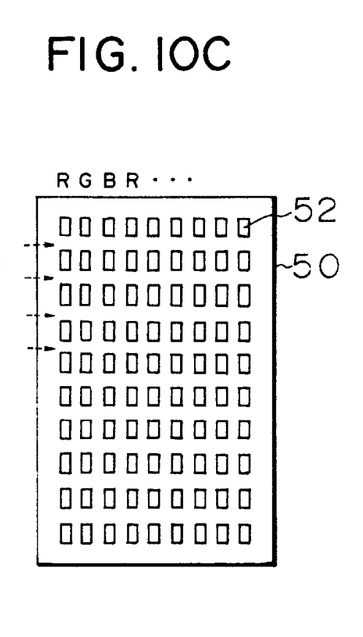
Figure 10D:
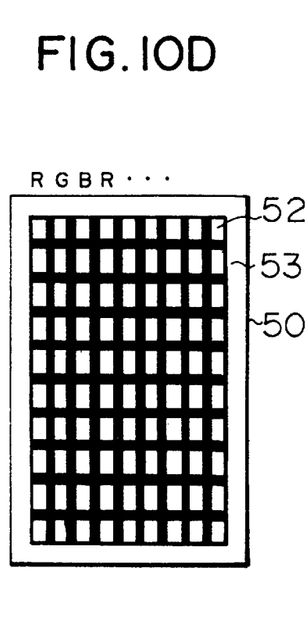
Figure 11:
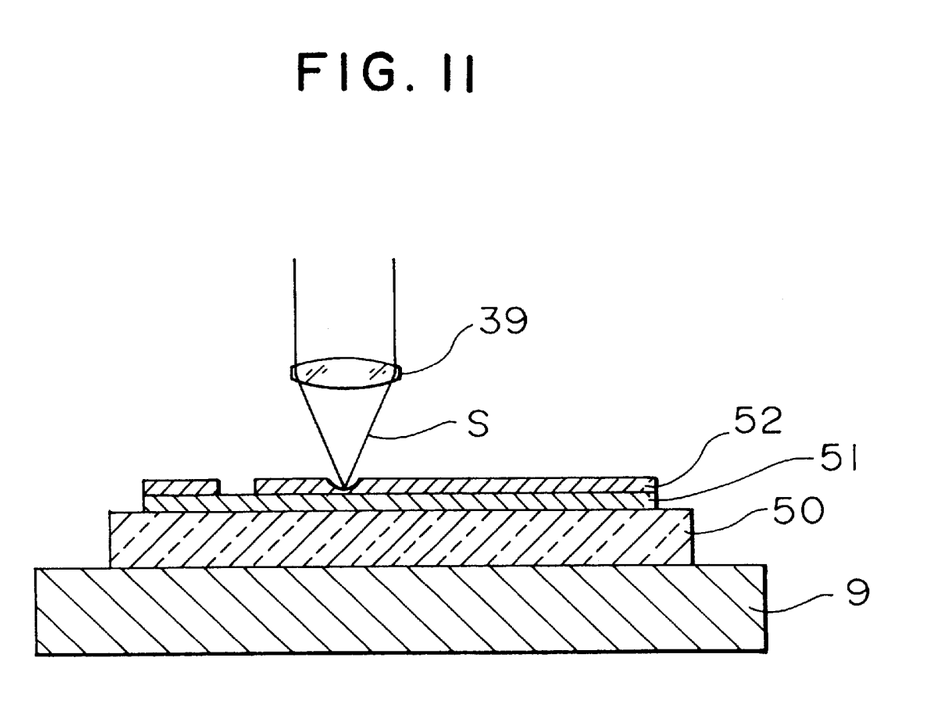
FIG. 11 is an illustration showing the step of laser-trimming a color filter in the fabrication process in FIG. 10.

In this case, FIG. 1 is a front view of an XY table built in a laser beam machine of the present invention, FIG. 2 is a side view of the XY table which is not entirely illustrated, FIG. 3 is a side view of the whole laser beam machine including the XY table, FIG. 4 is a side view of a safety cover covering the laser beam machine corresponding to the portion in FIG. 3, FIG. 5 is an illustration showing the layout of an optical system set on the optical path of a laser beam of the laser beam machine, FIG. 6 is an illustration showing a laser beam oscillator of the laser beam machine, FIG. 7 is a top view showing a state in which a degaussing cover is set to the laser beam oscillator shown in FIG. 6, FIG. 8 is an illustration showing a laser beam applying portion of the laser beam machine, FIG. 9 is a characteristic diagram showing energy distributions about the optical axis of a laser beam emitted from an optical fiber of the optical system shown in FIG. 5, FIGS. 10A to 10D are illustrations of steps showing a liquid crystal display device fabrication method for trimming a color filter by the laser beam machine, and FIG. 11 is an illustration showing the step of trimming a color filter in the manufacturing process in FIG. 10.

The laser beam machine of this embodiment, as shown in FIG. 3, comprises machine body 1 for applying a laser beam (YAG laser) supplied from laser beam oscillator 5 to a workpiece by leading the laser beam by an optical system comprising a lens group and a beam splitter, XY table 2 capable of transferring a mounted workpiece in two directions perpendicular to each other by a linear motor, surface plate (base plate) 3 with the machine body 1 and XY table 2 mounted on it, and vibration absorption base 4 with surface plate 3 mounted on it, and safety cover 7 (see FIG. 4) using cover frame 6 shown by a chain double-dashed line in FIG. 3 as a support frame covers the laser beam machine, vacuum pump 8, and the like. Symbol 21 in FIG. 1 shows an optical surface plate with machine body 1 mounted on it and optical surface plate 21 is supported by surface plate 3 through support 22.

XY table 2 built in the laser beam machine comprises attraction table 9 capable of attracting and fixing a mounted workpiece by attracting air through a plurality of attraction holes formed on the surface, X table 10 for rotatably supporting attraction table 9 by inserting cylindrical spindle 10a into a shaft hole formed at the bottom center of attraction table 9, support table 11 with a concave cross section at whose both ends a pair of parallel X-axis rail sections 11a for slidably supporting XY table 10 are formed, X-axis linear motor 12 set inside of support table 11 to linearly reciprocate XY table 10 along X-axis rail sections 11a, X-axis linear encoder 13 for detecting position data of X table 10, Y table 14 with support table 11 mounted on it, three Y-axis rails 15 and 16 extending in the direction perpendicular to X-axis rail sections 11a to slidably support Y table 14, Y-axis linear motor 17 for linearly reciprocating Y table 14 along Y-axis rails 15 and 16, and Y-axis linear encoder 18 for detecting position data of Y table 14. An air gap is formed between X table 10 and each of X-axis rail sections 11a and between Y table 14 and each of Y-axis rails 15 and 16 respectively so that a workpiece can smoothly be transferred in X and Y axis directions by decreasing the frictional force with these air gaps.

In FIG. 1, symbol 3a denotes a setting groove formed on surface plate 3 in order to make positioning in the cross direction by inserting the bottom of each of Y-axis rails 15; symbols 16, 17a, 17b, and 17c respectively denote a coil, a magnet, and a yoke constituting Y-axis linear motor 17; and symbols 18a and 18b respectively denote a detection section and a scale section (linear scale) of an optical device or the like constituting Y-axis linear encoder 18. Moreover, in FIG. 2, symbol 10b denotes an air blowoff surface of X table 10; symbols 12a, 12b, and 12c respectively denote a coil, a magnet, and a yoke constituting X-axis linear motor 12, symbols 13a and 13b respectively denote a detection section and a scale section (linear scale) of an optical device constituting X-axis linear encoder 13; and symbol 20 denotes a motor for rotating attraction table 9 about spindle 10a. Symbol P in FIG. 2 denotes a point of application of a magnetic driving force generated by X-axis linear motor 12. This embodiment is constituted so that X table 10 does not cause backlash when it starts or stops by almost aligning the point of application P with the center of gravity of X table 10.

The laser beam machine including XY table 2 can move a workpiece mounted on attraction table 9 at a high positional accuracy in a horizontal plane by controlling XY table 2. Therefore, it is possible to draw a desired pattern on the workpiece by irradiation with a spot-like laser beam (beam spot) emitted from the front end portion (object glass) of the optical system of machine body 1 by moving the workpiece along a predetermined orbit to the laser beam.

Linear motors 12 and 17 built in XY table 2 generate a strong magnetic force in order to drive a heavy object. Therefore, in the case of this embodiment, the laser beam machine is completely covered with safety cover 7 mainly made of a ferromagnetic material so that the magnetic force of linear motors 12 and 17 does not affect monitoring CRTs and measuring instruments arranged nearby. That is, safety cover 7, as shown in FIGS. 3 and 4, is constituted by setting an iron plate or a degaussing plate to cover frame 6 serving as a support frame. Specifically, portion "a" in FIG. 4 is a portion to which an SUS-304 stainless steel plate is set and portions "b" and "c" are portions comprising a two-layer structure in which an SUS-430 degaussing plate is set inside the SUS-304 stainless steel plate so as to improve the degaussing effect. Among these portions, portion "c" is a double-leaf cover to be opened or closed and portion "d" is a portion comprising a three-layer structure in which the outside of a colored acrylic plate has the same structure as portion "c". Thus, by covering the laser beam machine with safety cover 7 having the degaussing effect and moreover forming a portion which may receive a strong magnetic force because it is located nearby linear motors 12 and 17 into a two-layer structure to improve the degaussing effect, the magnetic force of linear motors 12 and 17 does not affect peripheral units and the optical system of laser beam machine 1 can easily be adjusted by opening the double-leaf cover of portion "c". Moreover, it is possible to directly, safely, and visually confirm whether a laser beam is correctly applied to a workpiece through the colored acrylic plate by opening the double-leaf cover of portion "d".

The structure of machine body 1 of the laser beam machine is described below in detail.

Laser beam oscillator 5 has a generally-known structure in which YAG rod 5b oscillates a laser beam by exciting YAG rod 5b with an electron beam E generated in arc lamp 5a as shown in FIG. 6. In the case of this embodiment, two laser beam oscillators 5 are arranged in parallel so that two laser beams can be supplied at the same time as shown in FIGS. 5 and 7.

Moreover, in the case of this embodiment, as shown in FIG. 7, degaussing cover 42 comprising a two-layer structure made of a ferromagnetic metallic plate and enclosing both arc lamps 5a is provided for the outer periphery of two laser beam oscillators 5. Specifically, degaussing cover 42 comprises bottom shield plate 42a made of an iron plate or permalloy plate to sufficiently enclose both arc lamps 5a and top shield plate 42b made of a silicon steel plate and having a width suitable for the size of both arc lamps 5a. The magnetic force generated by linear motors 12 and 17 of XY table 2 is extremely weakened inside of degaussing cover 42 due to the degaussing effect of these two shield plates 42a and 42b made of a ferromagnetic material. Therefore, electron beam E of arc lamp 5a of each laser beam oscillator 5 is not bent due to the magnetic force of linear motors 12 and 17 and thereby, the power or mode of a laser beam supplied from each laser beam oscillator 5 does not change or the service life of arc lamp 5a is not deteriorated.

The optical system of machine body 1 is described below. Two laser beams supplied from two laser beam oscillators 5 are led along each optical path shown in FIG. 5. Because an optical system having the same structure as the optical system of machine body 1 is arranged in the optical path of each laser beam of two laser beam oscillators 5, only the optical system of either laser beam is provided with symbols and described below.

A laser beam emitted from laser beam oscillator 5 is first reflected by reflecting mirror 24 after passing through acousto-optical device (AOM) 23 and then, the laser beam is made to enter first phase difference plate 25 also referred to as ¼λ plate where a linear polarized beam is converted to a circular polarized beam. In this case, acousto-optical device 23 is a type of a switching device. When device 23 is switched on, it is possible to convert most part of an incident beam (laser beam) to an unusable beam by adding ultrasound to distort the optical axis of the beam. That is, acousto-optical device 23 directly passes a laser beam because it is kept off while performing laser beam machining but it is changed to the off state to temporarily stop the laser beam machining.

The circular polarized laser beam emitted from first phase difference plate 25 is reflected by reflecting mirror 27 after passing through diffusion preventive lens 26 and thereafter, made to enter first beam splitter 28 and divided into linear polarized beams to be bound for two directions. Thereby, two divided beams capable of simultaneously machining a plurality of portions with laser beams are obtained. However, to perform fine machining such as thin-film precision machining, the power (energy level) of each divided beam emitted from first beam splitter 28 must equally be set. In fact, however, a slight fluctuation easily occurs in the powers of two divided beams (linear polarized beams) due to a setting error of each member. Therefore, this embodiment makes it possible to easily adjust the powers of two divided beams by rotatably setting first phase difference plate 25 in an optical path and properly rotating phase difference plate 25.

One divided beam emitted from first beam splitter 28 passes through optical fiber 43 after passing through reflecting mirror 29 and then, it is made to enter second rotatable phase-difference plate 30 and converted to a circular polarized beam again. The circular polarized beam is enlarged into an ellipse after passing through cylindrical lens 31, made to enter second beam splitter 35, and divided into linear polarized beams to be bound for two directions. Similarly, the other divided beam emitted from first beam splitter 28 passes through reflecting mirror 32 and optical fiber 44 and then, it is made to enter third rotatable phase difference plate 33 and converted to a circular polarized beam. The circular polarized beam is enlarged into an ellipse after passing through cylindrical lens 34 and then, it is made to enter second beam splitter 35 and divided into linear polarized beams to be bound for two directions. That is, when a laser beam emitted from laser beam oscillator 5 passes through a predetermined optical path and is emitted from second beam splitter 35, it is divided into four laser beams. Also in this case, powers of the four divided beams can easily be adjusted by properly rotating second and third phase-difference plates 30 and 33.

This embodiment uses a splitter obtained by bonding two prisms each other as first and second beam splitters 28 and 35 respectively. However, it is also possible to use a splitter obtained by forming a reflecting layer on one side of a flat glass plate.

Moreover, optical fibers 43 and 44 set before second and third phase difference plates 30 and 33 respectively in the above optical path are generally-known optical fibers obtained by covering a quartz material with a reflecting film. Therefore, because a laser beam transmitted while being reflected by the reflecting film is emitted under a state in which single mode is converted to multimode, the energy distribution curve of laser beams made to enter optical fibers 43 and 44 about the optical axis is emitted under a state in which it is converted to the top hat shape of the multimode shown by symbol L1 in FIG. 9, in order words, a state of increasing the area of the high-energy domain about the optical axis.

When four divided beams are emitted from second beam splitter 35, these beams pass through aperture 36 and then pass through convergent lens 37 and imaging lens 38 and thereafter, they are made to enter object glass 39 located at the front end of the optical path. Thus, four divided beams parallel to each other are applied as spots toward machining surface A from object glass 39. In fact, however, a laser beam emitted from another laser beam oscillator 5 is emitted from another object glass located at the front end of the optical path to the machining surface as four divided beams. Therefore, as a result, this embodiment makes it possible to simultaneously machine a plurality of portions with laser beams because a total of eight divided beams are applied to a workpiece arranged on the machining surface as spots.

Moreover, a rectangular light-transmission hole 36a for passing each divided beam is arranged at four portions on aperture 36 in parallel. When each divided beam passes through light transmission hole 36a opening in the optical path, the beam is formed into a rectangular shape preferred to high-speed machining. Moreover, each divided beam made to enter aperture 36 is a multimode laser beam passing through optical fiber 43 or 44. Therefore, as long as the optical axis of the laser beam is not extremely deviated from the center of light transmission hole 36a opening in the optical path, the shape of a beam passing through aperture 36 is formed only at a high-energy portion of the laser beam but an unnecessary low-energy portion is not led to object glass 39. That is, when the optical axis (position where horizontal-axis coordinate is 0) of a laser beam made to enter aperture 36 is slightly deviated from the center (horizontal-axis coordinate of alternate long and short dash line C) of light transmission hole 36a with a width w opening in the optical path as shown in FIG. 9, if the energy distribution curve about the optical axis shows Gaussian normal distribution (shown by broken line L2), the lower energy portion of a laser beam also passes through aperture 36. Therefore, the low-energy portion is applied to machining surface A and thereby, laser machining is not preferably performed at only the portion. Thus, problems of defective machining such as trimming width error and fluctuation occur. In the case of this embodiment, however, the energy distribution curve about the optical axis of a laser beam made to enter the aperture 36 has a top hat shape (actual line L1). Therefore, even if the optical axis is slightly deviated from the center of light transmission hole 36a, the low-energy portion of the laser beam does not pass through aperture 36. Therefore, beam spot S (see FIG. 8) emitted from object glass 39 can be set to a laser beam whose light energy about the optical axis is almost uniform and dimensional errors of a machined shape are greatly decreased.

A laser beam emitted from laser beam oscillator 5 has a wavelength of 380 nm or less. For example, a color filter at the portion scanned and irradiated with a laser beam comprising third harmonic (355 nm) of a laser beam generated by a solid YAG laser is removed by causing thermal deformation such as fusion, evaporation, or sublimation on the color filter. Particularly when a short-wavelength laser beam with a wavelength of 280 nm or less is used, it is possible to prevent an undesired results that a laser beam entering a transparent substrate (glass substrate) is reflected on the other side of the transparent substrate (glass substrate) and the reflected laser beam is applied to other color filter to remove a part of the color filter because the short-wavelength laser beam with a wavelength of 280 nm or less does not enter the transparent substrate (glass substrate) (light transmittance of 0%) through one side of the transparent substrate (glass substrate). Thus, it is possible to fabricate a color filter with a higher machining quality.

FIG. 8 shows beam applying section 40 including object glass 39 located at the front end of the above optical path, which is provided with not only funnelform nozzle 41 for surrounding beam spot S but also air feed section 40a for jetting compressed air between nozzle 41 and object glass 39 and air attraction section 40b for forcibly attracting the air nearby the front end of nozzle 41 so that a compressed air stream (arrow in FIG. 8) is formed from the upper side to the lower side along the conical inner wall surface of nozzle 41. That is, this embodiment attracts most of smoke produced in laser machining by air attraction section 40b and leads it to an exhaust route so that the smoke containing metallic components does not affect the health of nearby operators. Even if some of the smoke enters nozzle 41, it is quickly exhausted from the bottom to the top of nozzle 41 by the compressed air stream so that it is not attracted into air attraction section 40b. Therefore, smoke hardly affects beam spot S and object glass 39.

This embodiment trimmed a color filter while a liquid crystal display device is fabricated and formed a desired color filter surrounded by an opaque film by the above laser beam machine.

The above fabrication art is described below. First, as shown in FIG. 10A, a plurality of transparent electrodes 51 extending in one direction at a certain pitch are formed on one side of transparent substrate 50 such as a glass substrate by patterning ITO. Then, as shown in FIG. 10B, color filters 52 of R (red), G (green), and B (blue) are superposed on each transparent electrode 51 in a predetermined arrangement by a technique such as the electrodeposition method or printing method. In this connection, for the example in FIG. 10B, color filters 52 are superposed in order of R, G, B, R, G, B, R .... After the color filters are superposed, they are baked at approx. 250° C. to solidify color filters 52.

Thereafter, transparent substrate 50 is mounted on attraction table 9 of XY table 2 to perform laser trimming for locally removing R, G, and B color filters 52 by applying eight divided beams at a certain pitch in the direction perpendicular to the longitudinal direction of color filters 52 while controlling XY table 2. Thereby, as shown in FIG. 10C, color filters 52 are obtained which are arranged in a predetermined layout though an opaque film is not formed. In FIG. 11 schematically showing the laser trimming of color filters 52, transparent substrate 50 on attraction table 9 is transferred in the direction perpendicular to the paper surface of FIG. 11 and beam spot S applied from object glass 39 removes unnecessary portions from color filters 52 in accordance with the movement of substrate 50.

After unnecessary portions are removed from color filters 52, opaque film 53 is formed at the gapped portion around color filters 52 by applying black resist to the color filter formed surface of transparent substrate 50 and drying it, and then applying exposure light to the black resist from the other side and removing unexposed black resist as shown in FIG. 10D.

Thus, the fabrication art of this embodiment of forming color filter 52 or opaque film 53 makes it possible to adjust powers of a plurality of divided beams by properly rotating phase difference plates 25, 30, and 33 arranged in the optical path of a laser beam so that the powers are not fluctuated. Therefore, as shown in FIG. 11, it is possible to easily supply a predetermined beam power for removing only color filters 52 from transparent electrode 51 to each divided beam neither. Thus, it is possible to efficiently apply laser-trimming to color filters 52 and greatly decrease the trimming time by applying a plurality of divided beams (specifically, 8 divided beams) to a plurality of portions at the same time. Moreover, as described above, this embodiment makes it possible to set beam spot S emitted from object glass 39 to a laser beam with an almost uniform light energy distribution about the optical axis and thereby perform accurate laser machining with less dimensional error or fluctuation in the trimming widths of color filters 52 because an energy distribution curve about the optical axis of a laser beam made to enter aperture 36 is formed into a top hat shape so that the low energy portion of the curve does not pass through aperture 36. Moreover, because this embodiment does not require a photoresist layer which must have been formed before baking a color filter in the case of the prior art, a problem does not occur that photoresist causes seizing and it is hardly removed and therefore, an advantage is also obtained that non-defective opaque film 53 can be formed around color filters 52.

When removing only color filters 52 by leaving transparent electrode 51 like the case of this embodiment, static electricity is not easily generated in the cleaning step and the rubbing step performed after removing the color filters. Therefore, an advantage is obtained that display irregularity or damage of an orientation film of a liquid crystal display device due to static electricity can be avoided.

As described above, the liquid crystal display device fabrication method of the present invention laser-trims color filters in a direction perpendicular to the longitudinal direction of the color filters at a certain pitch by applying a plurality of divided beams to a workpiece in which a plurality of transparent electrodes and color filters superposed on the transparent electrodes are previously formed on a transparent substrate while mounting the workpiece on an XY table and moving it along a predetermined orbit. Moreover, the method of the present invention prevents the powers of divided beams from fluctuating by properly rotating a phase difference member provided for the optical system of a laser beam machine. Therefore, the method of the present invention has excellent advantages that it is possible to omit the masking step and the photoresist exposing and developing steps, simplify the fabrication process, avoid insufficient exposure of an opaque film due to seizing of photoresist, and resultingly form a non-defective opaque film around color filters at a low cost.

Moreover, because a short-wavelength laser beam, specifically, a short-wavelength laser beam with a wavelength of 380 nm or less is used to locally remove red (R), green (G), and blue (B) color filters by a common laser beam, the light transmittance of a short-wavelength laser beam with a wavelength of 380 nm or less to red (R), green (G), and blue (B) color filters comes to approx. 10% or less respectively and a short-wavelength laser beam with a wavelength of 380 nm or less is almost uniformly reflected on red (R), green (G), and blue (B) color filters. Moreover, when a short-wavelength laser beam with a wavelength of 380 nm or less is almost uniformly reflected on red (R), green (G), and blue (B) color filters, removal (cutting) widths of red (R), green (G), and blue (B) color filters by a short-wavelength laser beam with a wavelength of 380 nm or less become equal. Therefore, there are advantages that red (R), green (G), and blue (B) color filters can be equalized in size, the machining quality of color filters can be prevented from deteriorating, and color filters with a high display quality can be fabricated.

What is claimed is:

1. A liquid crystal display device fabrication method comprising the steps of:

providing a laser beam machine, said laser beam machine having a laser beam machine body, said laser beam machine body containing a laser beam oscillator, a phase difference member, and at least one beam splitter;

providing a first table and a second table, said first table arranged over said second table, said first table adjustable in a first direction and said second table adjustable in a second direction, said first direction perpendicular to said second direction;

mounting a workpiece on said first table, said workpiece having a plurality of color filters and a plurality of transparent electrodes formed on a transparent substrate, said plurality of transparent electrodes extending in parallel in a longitudinal direction, and each of said plurality of color filters superposed on each of said transparent electrodes;

producing a linearly polarized laser beam via said laser beam oscillator;

converting said linearly polarized laser beam to a circularly polarized laser beam via said phase difference member;

splitting said circularly polarized laser beam into a plurality of linearly polarized laser beams via said at least one beam splitter;

collimating said plurality of linearly polarized laser beams via an object glass;

removing a portion of each of said plurality of color filters by applying said plurality of collimated linearly polarized laser beams to each of said plurality of color filters while moving at least one of said first table in said first direction and said second table in said second direction, said plurality of collimated linearly polarized laser beams being applied along a direction perpendicular to said longitudinal direction and at a predetermined pitch such that only said portions of each of said plurality of color filters local to spots formed by said plurality of collimated linearly polarized laser beams are removed thus forming a plurality of separate color filters on each of said transparent electrodes; and forming a shading film around said separate color filters by a photolithographic method.

2. A liquid crystal display device fabrication method according to claim 1, wherein said laser beam has a wavelength of less than 80 nm.

3. A liquid crystal display device fabrication method according to claim 1, wherein said laser beam has a wavelength of less than 280 nm.

4. A liquid crystal display device fabrication method according to claim 1, wherein said plurality of collimated linearly polarized laser beams contains at least four collimated linearly polarized laser beams.

5. A liquid crystal display device fabrication method according to claim 1, wherein said phase difference member is a phase difference plate capable of rotating about the optical axis of the laser beam emitted from said laser beam oscillator.

* * * * *